United States Patent
Koch

(10) Patent No.: US 11,756,903 B2
(45) Date of Patent: Sep. 12, 2023

(54) RADAR SENSOR, MOTOR VEHICLE AND METHOD FOR PRODUCING A RADAR SENSOR

(71) Applicant: AUDI AG, Ingolstadt (DE)

(72) Inventor: Niels Koch, Reichertshofen (DE)

(73) Assignee: Audi AG, Ingolstadt (DE)

( * ) Notice: Subject to any disclaimer, the term of this patent is extended or adjusted under 35 U.S.C. 154(b) by 513 days.

(21) Appl. No.: 16/750,179

(22) Filed: Jan. 23, 2020

(65) Prior Publication Data
US 2020/0243463 A1     Jul. 30, 2020

(30) Foreign Application Priority Data

Jan. 24, 2019 (DE) .................. 102019200902.6

(51) Int. Cl.
*H01L 23/66*    (2006.01)
*H01L 23/498*   (2006.01)
(Continued)

(52) U.S. Cl.
CPC ............ *H01L 23/66* (2013.01); *G01S 13/931* (2013.01); *H01L 23/49816* (2013.01);
(Continued)

(58) Field of Classification Search
CPC .............. H01L 23/66; H01L 2223/6627; H01L 2223/6677; H01L 2223/6683; H01L 23/49816; H01L 23/49827; H01Q 1/2283; H01Q 23/00; H01Q 1/3233; G01S 13/931; H05K 2201/10734
See application file for complete search history.

(56) References Cited

U.S. PATENT DOCUMENTS

| 3,023,381 A | 2/1962 | Rowland |
| 9,070,961 B2 | 6/2015 | Suzuki |

(Continued)

FOREIGN PATENT DOCUMENTS

| CN | 102144289 A | 8/2011 |
| CN | 102217064 A | 10/2011 |

(Continued)

*Primary Examiner* — Aaron J Gray
(74) *Attorney, Agent, or Firm* — Sterne, Kessler, Goldstein & Fox P.L.L.C.

(57) ABSTRACT

Radar sensor, having an antenna assembly and a monolithic microwave integrated circuit that is arranged on a circuit board of the radar sensor and comprises at least one antenna connection that is to be connected to the antenna assembly, in particular is implemented in a ball grid, provides radar signals to be emitted, which can be generated by the microwave circuit, or accepts received radar signals from the antenna assembly, the connection of the antenna connection to the antenna assembly being formed at least in part by a waveguide, wherein, for connecting the at least one antenna connection to the waveguide designed as a wave duct, the circuit board comprises, at the position of the antenna connection, a through-opening leading to the side of the circuit board opposite the microwave circuit, through which the antenna connection is connected to a radiation element projecting into the waveguide arranged on the opposite side of the circuit board at the position of the antenna connection.

9 Claims, 4 Drawing Sheets

(51) Int. Cl.
*G01S 13/931* (2020.01)
*H01Q 1/32* (2006.01)
*H01Q 1/22* (2006.01)
*H05K 1/18* (2006.01)
*H01Q 23/00* (2006.01)

(52) U.S. Cl.
CPC ..... *H01L 23/49827* (2013.01); *H01Q 1/2283* (2013.01); *H01Q 1/3233* (2013.01); *H01Q 23/00* (2013.01); *H05K 1/181* (2013.01); *B60W 2420/52* (2013.01); *B60Y 2400/3017* (2013.01); *H01L 2223/6627* (2013.01); *H01L 2223/6677* (2013.01); *H01L 2223/6683* (2013.01); *H05K 2201/10734* (2013.01)

(56) References Cited

U.S. PATENT DOCUMENTS

| | | | |
|---|---|---|---|
| 9,318,449 B2 | 4/2016 | Hasch et al. | |
| 10,615,134 B2 | 4/2020 | Spella et al. | |
| 2003/0168674 A1* | 9/2003 | Muller | G01F 23/284 257/200 |
| 2003/0231078 A1 | 12/2003 | Koriyama et al. | |
| 2006/0202312 A1* | 9/2006 | Iijima | H01Q 1/2283 257/664 |
| 2009/0251357 A1* | 10/2009 | Margomenos | G01S 13/931 342/70 |
| 2011/0285606 A1 | 11/2011 | De Graauw et al. | |
| 2013/0181859 A1 | 7/2013 | Waldschmidt et al. | |
| 2015/0229027 A1* | 8/2015 | Sonozaki | H01Q 21/005 343/771 |
| 2015/0364816 A1 | 12/2015 | Murugan et al. | |
| 2016/0093936 A1* | 3/2016 | Suzuki | H01P 5/107 333/21 R |
| 2020/0052362 A1* | 2/2020 | Yu | H01Q 1/2283 |

FOREIGN PATENT DOCUMENTS

| | | | |
|---|---|---|---|
| CN | 103026254 A | 4/2013 | |
| CN | 104145369 A | 11/2014 | |
| CN | 108428693 A | 8/2018 | |
| DE | 102016224936 A1 | 6/2018 | |
| EP | 2945222 A1 | 11/2015 | |
| GB | 2499792 A | 9/2013 | |
| JP | 2000349544 A | 12/2000 | |
| KR | 20140059026 A | 5/2014 | |
| TW | 202010176 A * | 3/2020 | ............... H01Q 1/02 |

* cited by examiner

RADAR SENSOR, MOTOR VEHICLE AND METHOD FOR PRODUCING A RADAR SENSOR

TECHNICAL FIELD

The disclosure relates to a radar sensor, comprising an antenna assembly and a monolithic microwave integrated circuit (MMIC) that is arranged on a circuit board of the radar sensor and comprises at least one antenna connection that is to be connected to the antenna assembly, in particular is implemented in a ball grid, provides radar signals to be emitted, which can be generated by the microwave circuit, or accepts received radar signals from the antenna assembly, the connection of the antenna connection to the antenna assembly being formed at least in part by a waveguide. In addition, the disclosure relates to a motor vehicle and to a method for producing such a radar sensor.

BACKGROUND

The use of radar sensors in motor vehicles has already been proposed in various ways in the prior art. In particular, radar sensors are used in the automotive field for monitoring surroundings, in order to supply radar data for various vehicle systems or vehicle functions. Long-range radar sensors (LRR—long-range radar) are used in motor vehicles, for example, for longitudinally regulating vehicle functions such as automatic cruise control (ACC). Radar sensors of this type sense the road far ahead and detect, for example, road users driving in front in order to approach the legal minimum distance from the road users driving in front and to adjust the speed or the like.

Particularly with regard to vehicle functions of longitudinally regulating driver assistance systems, the best possible, uniform speed adjustment to the road user driving in front is desired. For this purpose, high-power radar sensors are used which are focused on the vehicle path, which results in a long range and good detection of objects that are in front. Long-range radar sensors have also already been proposed for the rear of motor vehicles, in the context of a lane-change assistance system, for example.

For radar sensors that are intended to provide high transmission power and thus a long range, it is important that the transmission power generated in a monolithic microwave highly integrated circuit (MMIC, can also be referred to as a monolithic highly integrated transceiver circuit) is transmitted into the antenna elements of the antenna assembly of the radar sensor with the lowest losses possible. Similarly, the received signal must be conducted to the MMIC with low loss and so as to be as immune to interference as possible.

Common MMICs, i.e. microwave circuits that are used in radar sensors, can produce a transmission power of 10-13 dBm, which corresponds to a maximum of approx. 20 mW. At higher transmission powers, there is a very high, selective heat at the integrated circuit (often also referred to as a die) with an approx. 50% degree of efficiency, such that bond wires can detach, or silicon or germanium, depending on the manufacturing strategy, is even destroyed.

Increasing the transmission power is therefore not a viable way to obtain a longer range of a radar sensor, in particular for automotive applications. The effect of interconnecting a plurality of transmitters in one radar sensor is also limited. With such an approach, there is also the challenge that this must take place in the correct phase, which entails a high level of circuitry complexity 2×10 mW transmission power of two transmitters therefore results in a maximum of 18 mW and only ideally 20 mW. Other approaches attempt to improve the degree of efficiency of the MIMIC, however, no useful results are currently available.

Therefore, options have usually been proposed in the prior art that pass the transmission power provided by the MIMIC to the antenna assembly with the lowest losses possible.

Antenna feed lines from the MIMIC to the antenna assembly are usually implemented by means of a coaxial cable, parallel wire lines or a wave duct, generally a waveguide. At average operating frequencies of the radar sensor, for example from 500 MHz to approx. 30 GHz, microstrip lines, fin lines or slot lines can also be used on the circuit board. Such line options are also referred to as substrate-guided waveguides. These approaches have the advantage that they can be applied to the circuit-board material (substrate material) that is present anyway and thus do not result in any further component or additional costs apart from development effort or costs. However, due to the open structure, the effectiveness of such an antenna line solution integrated on the substrate is low and susceptible to interference from outside interfering signals, in particular with regard to EMC irradiation and radiation.

In higher frequency ranges, for example in the highest frequency range, where the 77 GHz radar band around 76-81 GHz is referred to, such solutions can no longer be used sensibly, and therefore, in this context, substrate-integrated waveguides or wave ducts have been proposed in order to transmit a radar signal with relatively low losses and also to ensure resistance to irradiation and interference. Over many years of using the 77 GHz radar band for automotive radar applications, in particular in the context of frequency band expansion to 81 GHz, it has been shown that the use of open microstrip structures is not suitable for such high frequencies, since excessive losses occur and the immunity to interference is insufficient. Substrate-integrated waveguides (SIW) have been proposed to counteract these problems. It is envisaged that the distribution networks and the signal transmission from the MMIC only have to be guided over the circuit board for a short distance and are then encapsulated in the waveguide by a connected or integrated antenna, which contributes to the interference immunity. Even with these solutions, however, there is still an open microstrip line between the MIMIC and the transition into the waveguide, although only for a short distance.

Another known approach is known as the "radiative coupling method." Here, a modified patch antenna is used as a radiator to radiate into a wave duct. The input wave continues in the wave duct and is thus passed to the destination, specifically the corresponding antenna elements of the antenna assembly. There are wave ducts having a standard size of 3.1×1.55 mm ("WR 12"), which have a lower cut-off frequency of approx. 60 GHz and a pure mode upper frequency of approx. 90 GHz. This type of waveguide is ideal for the 77 GHz radar band in the interval from 76-81 GHz and is therefore preferred. However, in order for it to be possible to effectively map a corresponding bandwidth of 4 GHz, the patch antenna must be modified, which means that its frequency bandwidth must be expanded. The radar signal is in turn guided to the patch antenna, which radiates into the wave duct, by an open microstrip line or the like.

Another approach is to transmit a TEM wave of a microstrip line into the wave duct having a TE wave structure by using quarter-wave transformations of approx. 30Ω of the microstrip line to the impedance of 500Ω of the waveguide. Since only a single quarter-wave transformer is narrow-banded, multi-stage quarter-wave transformations are carried out.

The last two approaches mentioned have in common that they initially require a microstrip line from the MIMIC and only then couple them into the wave duct, by radiation or transformation.

In summary, current coupling-in methods used in the prior art utilize a circuit-board-guided (substrate-guided) open line structure from the MIMIC in order to then couple into a waveguide by radiation or transformation. However, the open line structure is susceptible to interfering irradiation, interfering radiation and losses. To reduce the losses, a high-quality, expensive substrate is required for the circuit board.

EP 2 945 222 A1 relates to the use of pin grid arrays (PGA) and/or ball grid arrays (BGA) on microwave or millimeter wave high-frequency parts. Here, on an underside of the high-frequency part, for example an MMIC, there is an arrangement of substantially spherical connections, in particular substantially in matrix form, the connections also being referred to as "ball pins." In a comparable manner, US 2015/0364816 A1 also relates to an MMIC comprising connections implemented in a ball grid array.

DETAILED DESCRIPTION

Figure 1:
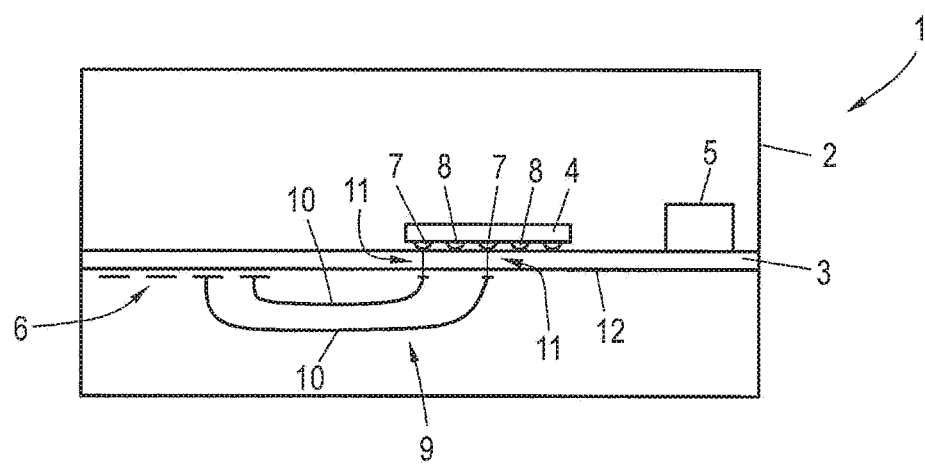
FIG. 1 is a schematic diagram of a radar sensor according to some embodiments of the present disclosure.

The problem addressed by the disclosure is to provide a lower-loss and more interference-immune option for coupling an antenna connection of an MMIC to a wave duct.

To solve this problem, it is provided according to the disclosure in a radar sensor of the type mentioned at the outset that, for connecting the at least one antenna connection to the waveguide designed as a wave duct, the circuit board comprises, at the position of the antenna connection, a through-opening leading to the side of the circuit board opposite the microwave circuit, through which the antenna connection is connected to a radiation element projecting into the waveguide arranged on the opposite side of the circuit board at the position of the antenna connection.

The present disclosure therefore proceeds from a monolithic microwave integrated circuit, that is to say an MMIC, the connections of which are implemented in a ball grid, in particular as a ball grid array (BGA). It is now proposed to use through-openings, possibly in the form of through-plated holes (VIA), at the positions of the antenna connections in order for it to be possible to radiate directly into the waveguide designed as a wave duct on the other side, i.e. by the shortest route, or to accept the radiation from said waveguide in the case of reception. In other words, the radiation element is provided directly opposite the antenna connection, which means that no conductors are necessary and provided in the plane in which the circuit board extends. The radiation element can therefore be understood to be a direct continuation of the antenna connection, i.e. the antenna pin, and therefore there is a direct connection into the wave duct. This means that no transformation lines are necessary.

Proceeding from a ball grid connection of the MMIC chip on the circuit board, the "ball" for transmitted and/or received signals, i.e. the at least one antenna connection, is therefore implemented as a through-plated hole by the highly integrated monolithic system, i.e. the MIMIC, such that there is a continuation of the signal pin from the MIMIC to the other side of the circuit board. The radiation element appears on the back of the circuit board and thus protrudes into the wave duct such that the radar signal can be coupled into the waveguide as a wave. For this purpose, the length of a radiation portion of the radiation element protruding into the waveguide is preferably selected to be at least substantially a quarter of a nominal wavelength of the frequency band used, for example to be approx. 1 mm at 77 GHz. In this way, a quarter-wave radiator is produced on the side of the circuit board opposite the MIMIC, which radiates into the wave duct. This basic concept is comparable to the patch-antenna solution from the prior art, which is implemented on the circuit-board side of the MMIC, but the direct continuation of the ball grid pin to be used as an antenna connection through the circuit board results in massive advantages.

Therefore, there are initially no open structures that can be irradiated or are susceptible to interference. The radiation element is mounted directly in the waveguide, which, as is standard, is metal-coated all around and thus has a shielding effect. The interference immunity is significantly improved. In addition, the line paths through the circuit board (substrate) are very short, for example 1 mm, and this results in improved effectiveness.

In summary, it is thus proposed according to the disclosure to form an extremely short path from the ball-grid antenna connection for the transmitted and/or received signal of the MIMIC, by the antenna connection being guided through the substrate, i.e. the circuit board, to the other side of the circuit board, such that a very short path, for example less than or equal to 1 mm, is produced within the circuit board and can be rated as extremely immune to interference. The coupling-in through the radiation element is produced so as to be encapsulated by the waveguide itself, which is designed as a wave duct, such that leakage radiation or external irradiation cannot occur. The efficiency and interference immunity are thus significantly increased. The development and manufacturing complexity is also reduced. A high-quality substrate can be used, but does not have to be used, since microstrip lines on the circuit board are no longer necessary.

Here, the circuit board is equipped with the MMIC chip and its required external circuitry, blocking capacitors, voltage and power supply as well as other processor-memory data lines, as is generally known, using standard components. Only the at least one antenna connection, i.e. the ball grid pin forming the transmission output and/or reception input, is brought through the through-opening to the other side of the component, i.e. the opposite side of the circuit board. The waveguide, which can be designed, for example, as a circular wave duct or rectangular wave duct and is connected to the antenna assembly, in particular comprises a small hole on the underside at its end facing away from the antenna assembly, while the rest of the waveguide is metal-coated, as is known. A metal contact, the radiation element, protrudes from this hole into the wave duct.

In a first embodiment of the present disclosure, it may be provided that the through-opening is designed as a through-plated hole to which the radiation element is connected. Through-plated holes (VIAs) have long been known in multi-layer circuit board manufacturing in particular and can also be cost-effectively manufactured for very small through-openings, for example in the range of 0.1 mm. The through-openings can be "drilled" into the circuit-board layers using a laser. In the subsequent electroplating process, in which copper is applied for conductor tracks and structures, the through-openings are filled with copper at least in part such that they become conductive and establish an electrical connection between the two sides of the circuit board. In particular in the case of a VIA designed as a closed through-opening, the radiation element can then accordingly be positioned on the corresponding through-plated hole on the opposite side of the circuit board.

In some embodiments, the radiation element extended through the circuit board is inserted into the through-opening, so as to directly contact the antenna connection. There is nothing to prevent the through-opening from being designed as a through-plated hole (VIA) as long as only the walls of the through-opening are coated. In this way, there is the particular advantage that the radiation element is additionally quasi retained by being inserted into the through-opening and can be connected to the antenna connection, in particular directly, for example by soldering. This is particularly advantageous with regard to the low manufacturing tolerances, for example at 77 GHz, since the mechanical challenges can be fulfilled in an improved manner. In some embodiments, the radiation element inserted into the through-opening has a cross section that tapers towards the antenna connection, in particular conically and/or in a needle-like manner. If the diameter of the through-opening is, for example, in the range of 0.1-0.3 mm, a configuration of the radiation element towards the antenna connection can be selected such that it tapers from a diameter of 0.45 mm to a diameter of 0.15 mm. Since commercially available household needles already have this shape and size, there is a good possibility for such radiation elements to be manufactured, although other starting and end diameters can of course also be selected depending on the application. In this embodiment, the tapering portion of the radiation element can be regarded as a "contacting needle," which is inserted into the through-opening in the circuit board from the side of the circuit board opposite the MMIC. On one hand, this results in the required electrically conductive contact, and on the other hand, as already described, results in mechanical stabilization of the radiation element and thus in particular also of the wave duct on the circuit board. Furthermore, a highly precise manufacturing process is possible.

In some embodiments, the radiation element is surrounded by an, in particular annular, insulation element at least in the inlet region into the waveguide. It can be particularly advantageous that the insulation element surrounding the radiation element over a length exceeding the inlet region has a supporting effect on the radiation element. The corresponding supporting effect is also transferred to the waveguide itself, in particular when the radiation element is inserted into the through-opening in the circuit board. For example, the insulation element, in particular in the form of an insulation and/or support disk, can engage positively or preferably non-positively in the hole in the wave duct through which the radiation element is intended to protrude into the wave duct. This provides stabilizing retention in all respects. In addition, the insulation element, in particular the insulation disk, prevents any electrically conductive contact between the metal-coated or metal surface of the wave duct and the radiation element before it protrudes into the wave duct. During manufacturing, the insulation element can, for example, be pressed into the corresponding hole in the wave duct. Embodiments are also conceivable that do not require such a support disk, for example when high mechanical forces are not expected.

In some embodiments, at least one ground connection of the microwave circuit is provided to be immediately adjacent to the antenna connection, in particular in the ball grid, and is likewise continued through the circuit board and is externally connected to the waveguide on the opposite side of the circuit board. Embodiments of MMICs have already been proposed in the prior art in which ground connections which shield the antenna connection are provided at the connection positions of the ball grid array that are directly adjacent to the antenna connection, for example on two opposite sides of the antenna connection and/or surrounding the antenna connection on four sides of the antenna connection. Such ground connections can also be particularly advantageously briefly brought into electrical contact with the metal-coated or metal waveguide through the substrate by means of a through-opening, in particular a through-plated hole or access to the ground surface of the circuit board, such that, within the circuit board, a type of Faraday cage is also produced around the antenna connection, which is continued to the radiation element. In this way, on one hand leakage radiation is minimized, but on the other hand, external irradiation is also significantly reduced in this region.

It can be provided that the radiation element is electrically conductively connected to the inner wall of the waveguide at its projecting end. If the end of the radiation element protruding into the wave duct is intended to be electrically conductively connected to the wave-duct wall, this can be carried out, for example, by means of a transverse contact needle, which may already be provided in particular as part of the wave duct or as part of the radiation element. Specifically, it may be provided, for example, that an end region of the radiation element is formed for contacting a side wall of the waveguide, in particular by an L-shape of the projecting radiation portion of the radiation element, the short leg of the L electrically contacting the inner wall of the waveguide. On the other hand, however, it is also possible for the waveguide to comprise a jumper which projects into its interior, preferably extending perpendicularly to the direction of extension of the projecting radiation portion of the radiation element and is electrically conductively connected to the end of the radiation element. A jumper of this type can for example be produced by 3D printing, such that a structure forming the jumper can already be part of the wave duct when it is manufactured. Then, for example, by inserting the radiation portion of the radiation element into the wave duct, the electrical contact with the jumper can be established, in particular by pressing the insulation element into the hole in the wave duct through which the radiation element projects into said wave duct.

A configuration having a radiation portion that has a bend, in particular forms an L-shape, may be expedient in particular if the wave duct is composed of a plurality of parts and is initially still open.

In some embodiments, it is particularly advantageous in terms of production that the waveguide, which is designed as a wave duct, is composed of two half-shells. This provides the possibility of initially positioning one of the half-shells, which, for example in a rectangular conductor, can comprise two complete side walls, on the opposite side of the circuit board, after which the radiation element can be inserted through the hole. It is particularly advantageous if the radiation element is also inserted into the through-opening, as described. This is because then, after the first half-shell of the wave duct has been attached, the radiation element can be guided through the hole and the through-opening for electrically contacting the antenna connection, the insulation element in particular being pressed into the hole at the same time and further mechanical stabilization thus being produced. The end of the radiation element facing the antenna connection can be soldered accordingly at this point. It is then possible to attach the second half-shell and close the wave duct. For a rectangular wave duct, this second half-shell can contain the remaining two walls, for example. If the radiation element itself has a "transverse contact needle," this is contacted mechanically or even electrically by the corresponding side wall in the process, for example as the short leg of an L. It should be noted that configurations are entirely conceivable in which the waveguide and possibly also the radiation element are metal-coated, and thus an electrical connection is established between the projecting end of the radiation element and the side wall of the wave duct only after the described assembly of the two half-shells.

In some embodiments, if the radiation element comprises a thickened portion that acts as a top capacitor at the end of its radiation portion projecting into the waveguide. In particular, if the bandwidth of the simply continued antenna connection is not sufficient as quarter-wave radiation into the wave duct, it may be expedient to apply a thickened portion at the end of the radiation element, for example in the manner of a pin head and/or in the manner of a cross member (T-shape). This produces a top capacitor and, in conjunction with the line length of the radiation portion, a resonant circuit. The result is a double-pole formation, which enables a wider usable impedance bandwidth. For the radar frequency range from 76-81 GHz, the entire 77 GHz radar band can be used with sufficient impedance matching and efficiency.

It is often the case, in particular for ball grids, that the antenna connections, separated by ground connections if necessary, follow one another in a relatively closely adjacent manner in one direction of the ball grid. Therefore, a closely sequential arrangement of the waveguides on the opposite side of the circuit board is desirable.

In this regard, in some embodiments, for a plurality of antenna connections which are successive in one direction, in particular separated by ground connections, the respectively assigned waveguides are implemented as a common waveguide block on the opposite side of the circuit board. Specifically, it may be provided here that the waveguide block, which in particular has a rectangular cross-sectional shape perpendicular to the transport direction, comprises an outer wall defining an interior, the interior being divided into the individual waveguides by partitions. In cases in which antenna connections follow one another in more than one direction, a matrix-like configuration of the waveguide block may also be provided.

In some embodiments, in the direction on the part of the MIMIC, the antenna connection-ground connection-antenna connection-ground connection-antenna connection etc. follow one another, for example in a ball grid array. The connections may have a spacing of 0.5 mm, while at the same time, for example for a TE wave, a 3.1 mm wide and 1.55 mm high waveguide cavity is required. Since the waveguides have to be connected so as to be at least partially upright anyway on the opposite side of the circuit board, a waveguide block that implements a plurality of waveguides in parallel at least for a certain length is particularly suitable in terms of stability, simple manufacturing and low complexity. Such a waveguide block can have, for example, a metal or metal-coated outer wall, the interior of which is divided into the waveguides by partition walls, for example metal or metal-coated ribs.

The waveguides can then be guided individually on the waveguide block, in particular by changing the direction towards the respective antenna elements or other circuit elements. This means that the change in direction only occurs in the further course of the energy transport, for example as a so-called 90° twist. Such a change in direction can also take place within the waveguide block itself.

In addition to the radar sensor, the present disclosure also relates to a motor vehicle comprising a radar sensor according to the disclosure. The radar sensor can preferably serve as a long-range radar sensor (LRR—long-range radar), thus supplying sensor data for a longitudinally regulating driver assistance system, for example an ACC system, and/or a lane-change assistance system. Of course, a plurality of radar sensors according to the disclosure can also be used in a motor vehicle. The radar sensors according to the disclosure in the motor vehicle preferably use the 77 GHz radar band, and therefore the radar frequency range of from 76-81 GHz.

Lastly, the disclosure also relates to a method for producing a radar sensor according to the disclosure, which comprises the following steps:
  providing the at least one through-opening in the circuit board,
  attaching the microwave circuit to the circuit board such that all the antenna connections are arranged above the through-openings assigned thereto, then, for each through-opening assigned to an antenna connection:
  arranging a half-shell of the waveguide having a hole for the radiation element above the through-opening,
  inserting the radiation element through the hole into the through-opening and making electrical contact with the antenna connection,
  closing the waveguide by attaching the other half-shell.

As has already been described with regard to the radar sensor, this is a particularly simple and cost-effective manufacturing option, an insulation element to be inserted into the hole in the wave duct in a positive or non-positive manner particularly preferably being used for further stabilization.

All descriptions relating to the radar sensor according to the disclosure can be analogously applied to the motor vehicle according to the disclosure and to the method according to the disclosure.

Further advantages and details of the present invention disclosure will become apparent from the embodiments described in the following and with reference to the drawings.

FIG. 1 is a general schematic diagram of a radar sensor 1 according to the disclosure. In the present case, this comprises a circuit board 3 retained in a housing 2 in the form of a substrate, on which, in addition to a monolithic microwave integrated circuit 4 (MMIC), further components 5 (only indicated here), such as capacitors, further chips and the like, may be provided. The radar sensor 1 further comprises an antenna assembly 6 which, for example as a patch-antenna assembly, can also be provided on the circuit board 3, but can also be provided outside the circuit board 3. The MMIC 4 comprises various connections, designed as ball grid pins of a ball grid array, on its underside facing the circuit board 3, in the present case in particular comprising antenna connections 7 and ground connections 8. The antenna connections 7, by means of which the radar signals can be provided or received radar signals can be accepted, are intended to be connected to the antenna assembly 6 via waveguides 9 (only indicated here), which are designed as wave ducts 10. In the context of the present disclosure, it is provided that the shortest possible contact path 11 between the antenna connections 7 and the waveguides 9 located on the opposite side 12 of the circuit board is ensured, which is why through-openings through the circuit board 3 are selected at positions that are exactly opposite the positions of the antenna connections 7, and this is only indicated in FIG. 1 and will be explained in greater detail in the following embodiments.

Figure 2:
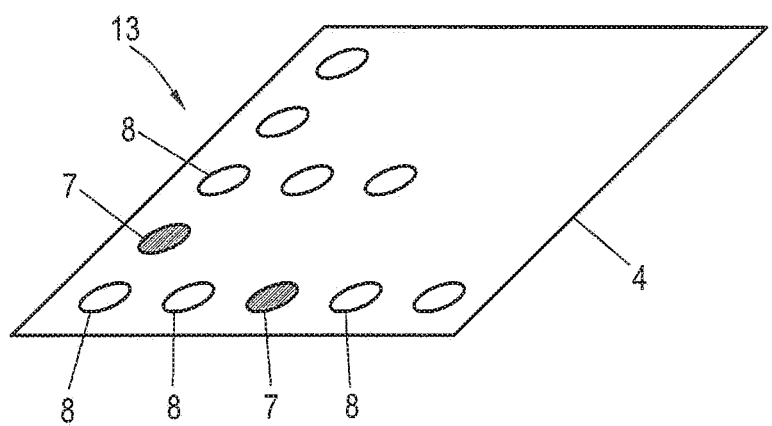
FIG. 2 shows a possible arrangement of connections in a ball grid according to some embodiments of the present disclosure.

FIG. 2 shows schematically possible arrangements of connections 7, 8 and further connections in a ball grid 13 on the underside of the MIMIC 4. In principle, in this figure, ground connections 8 that serve to shield the antenna connections 7 are provided adjacently to the antenna connections 7.

Figure 3:
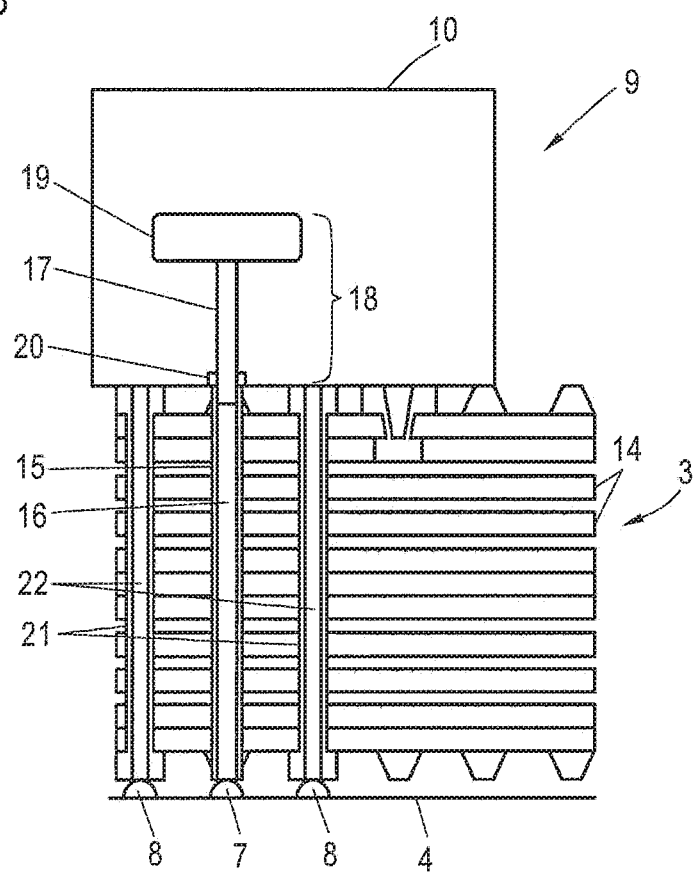
FIG. 3 is a cross section through the region of an antenna connection in a first embodiment.

FIG. 3 is a cross section through the contacting region in a first, specific embodiment.

As can be clearly seen, the circuit board 3 is constructed from different circuit-board layers 14 in the present case. At the position of each antenna connection 7 of the MIMIC 4, a through-opening 15 is provided through the circuit board 3, which, in this embodiment, is also metal-coated, thus forming a through-plated hole 16. This is electrically connected on one side to the antenna connection 7, for example by soldering. On the other side, a radiation element 17 is positioned on the through-plated hole 16, which comprises a radiation portion 18 that protrudes into the waveguide 9, which is designed here as a rectangular wave duct, which, in the case of radar signals to be transmitted, radiates said signals into the waveguide 10 as a wave or, in the case of received radar signals, receives said signals by means of the waveguide 10. In this embodiment, the radiation portion 18 also has a thickened portion 19, which acts as a top capacitor and, in conjunction with the line length of the radiation portion 18, produces an oscillating circuit, such that there is a wider usable impedance bandwidth.

For insulation from the metal or metal-coated wave duct 10 and for support, the radiation element 17 is surrounded by an insulation element 20 made of an insulating material at least in the region of the hole in the wave duct 10 through which the radiation element 17 projects into the wave duct 10.

In order to further improve the shielding and thus increase the interference immunity, which is already low due to the short path of the through-plated hole, according to FIG. 3 further through-openings 21 are provided at the positions of the ground connections 8, which, in the present case, are also designed as through-plated holes 22 and connect the ground connections 8 to the outside of the wave duct 10 such that the corresponding through-plated holes 22 have a shielding effect on the through-plated hole 16.

Figure 4:
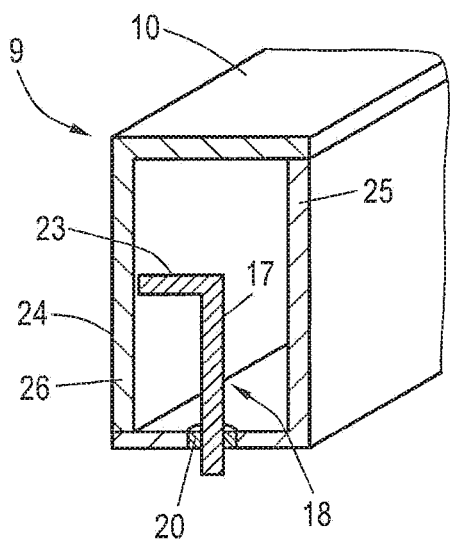
FIG. 4 shows a configuration of the waveguide and the radiation element in a second embodiment.
Figure 5:
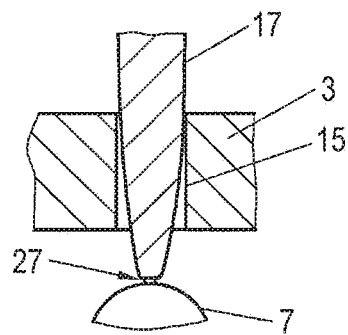
FIG. 5 is a cross section through the radiation element shape in the second embodiment.

FIGS. 4 and 5 explain a further, preferred, second embodiment of the present disclosure, with FIG. 4 initially only showing the waveguide, which in turn is designed as a rectangular wave duct 10, into which the radiation portion 18 of the radiation element 17 protrudes, which is in turn supported by an insulation element 20 designed as an insulation disk. In the present case, the radiation portion 18 is L-shaped, the short leg 23 acting as a transverse contact needle in order to electrically conductively connect the end of the radiation portion 18 to a side wall 24 of the wave duct 10.

As can be seen in the present case, which is also possible in the embodiment according to FIG. 3, the wave duct 10 is constructed from two half-shells 25, 26, such that the half-shell 25 having the hole can first be arranged at the position of the through-opening 15, and then the radiation element 17 can be inserted, for example by the insulation element 20 being pressed into the hole for being non-positively retained, at which point the second half-shell 26 can be positioned, the semiconductor 10 is closed and the leg 23 is brought into contact with the side wall 24.

FIG. 5 schematically shows the configuration of the radiation element 17 in the region of the through-opening 15, through which it projects in the present case. This means that, in this case, there is at least no complete through-plated hole 16, but instead the through-opening 15 remains open, such that the radiation element 17 can be inserted into the through-opening 15 until electrical contact can be made with the antenna connection 7 via its tip 27. In order to simplify this, also with regard to the rather narrow through-opening 15 and the antenna connection 7 which may be narrow, the radiation element 17 is designed to taper in diameter in a needle-like manner or conically.

By inserting the radiation element 17 into the through-opening 15 and making direct contact with the antenna connection 7, improved mechanical retention and more effective transmission are ensured.

It should be noted that, of course, in the second embodiment according to FIGS. 4 and 5, through-plating of the ground connections 8, as described with reference to FIG. 3, can also be carried out.

Figure 6:
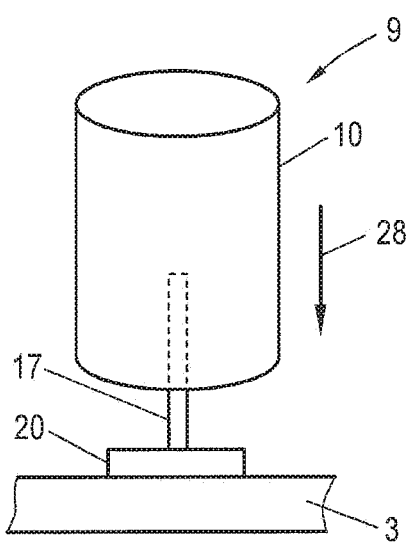
FIG. 6 is a schematic view when using a round wave duct in a third embodiment.

FIG. 6 is a rough schematic view of a third embodiment in which a round wave duct 10 is used as a waveguide 9 and can be attached to the insulation element 20, which in turn is designed as an insulation disk, over the radiation element 17 according to the arrow 28.

Figure 7:
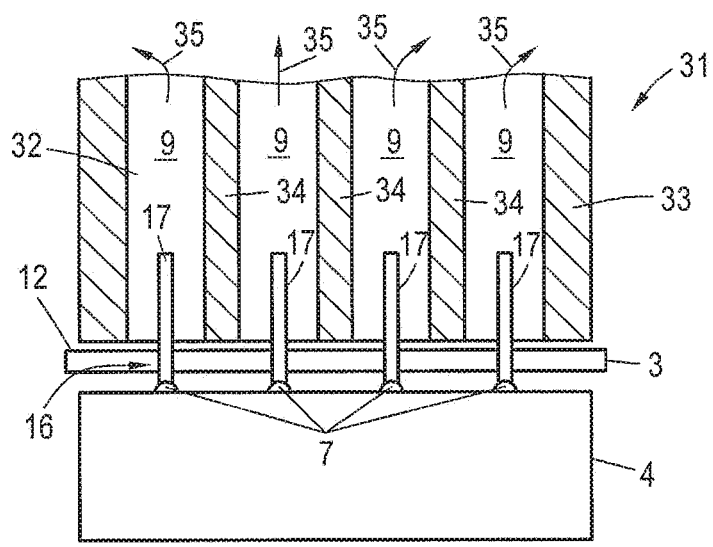
FIG. 7 is a schematic view when using a waveguide block in a fourth embodiment.

FIG. 7 is a schematic drawing when using a waveguide block 31 in a fourth embodiment. By contrast with the previous embodiments, the other configurations of which can of course be accordingly transferred to the fourth embodiment, an individual waveguide per antenna connection 7 is not connected to the relevant radiation element 17, but instead the radiation elements 17 each protrude into a waveguide 9 which is part of the interior 32 of the continuous waveguide block 31. The waveguide block 31 thus has a metal or metal-coated outer wall 33 having an at least substantially rectangular cross section, in the interior 32 of which the waveguides 9 are formed by metal or metal-coated dividing walls or partitions 34. These are initially guided in parallel, but can then be guided to their respective antenna elements in a known manner, as indicated by the arrows 35.

Figure 8:
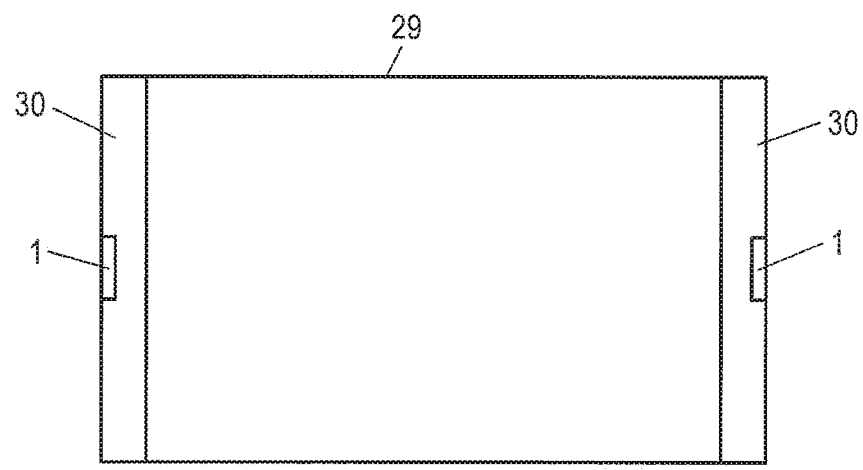
FIG. 8 shows a motor vehicle according to some embodiments of the present disclosure.

FIG. 8 lastly shows a schematic drawing of a motor vehicle 29 according to the disclosure. In the present case, said vehicle comprises two radar sensors 1 according to the disclosure, which are each installed in bumpers 30 and serve as LRRs, i.e. long-range radar sensors, and in the present case are operated in the 77 GHz radar band with high power and thus a long range. The sensor data from the radar sensors 1 can be used, for example, for driver assistance functions, for example ACC functions and/or lane-change assistance functions.

The invention claimed is:

1. A radar sensor, comprising:
an antenna assembly;
a monolithic microwave integrated circuit (MIMIC) arranged on a circuit board, the MIMIC providing at least one antenna connection to the antenna assembly by a waveguide arranged on an opposite side of the circuit board, wherein the at least one antenna connection is implemented using a ball grid; and
the circuit board comprising a through-opening at a position of the at least one antenna connection, leading to a side of the circuit board opposite the MMIC, wherein:
the at least one antenna connection is connected, through the through-opening, to a radiation element projecting into the waveguide exceeding an inlet region of the waveguide;
the radiation element being surrounded by an annular insulation element at least in the inlet region into the waveguide; and
the through-opening comprises a through-plated hole connected to the radiation element.

2. The radar sensor according to claim 1, wherein the radiation element is inserted into the through-opening, and extends through the circuit board so as to directly contact the antenna connection.

3. The radar sensor according to claim 1, wherein the annular insulation element surrounds the radiation element over a length exceeding the inlet region and supports the radiation element.

4. The radar sensor according to claim 1, wherein the MIMIC further comprises a ground connection immediately adjacent to the antenna connection, the ground connection continuing through the circuit board and is externally connected to the waveguide on the opposite side of the circuit board.

5. The radar sensor according to claim 1, wherein the waveguide is a wave duct comprising two half-shells.

6. The radar sensor according to claim 1, wherein the radiation element comprises a thickened portion at an end of a radiation portion projecting into the waveguide, wherein the thickened portion acts as a top capacitor.

7. The radar sensor according to claim 1, wherein two or more antenna connections are successive in one direction and separated by ground connections, and respectively assigned waveguides are implemented as a common waveguide block on the opposite side of the circuit board.

8. The radar sensor according to claim 7, wherein the common waveguide block comprises:
a rectangular cross-sectional shape perpendicular to a transport direction; and
an outer wall defining an interior, the interior being divided into individual waveguides by partitions.

9. A motor vehicle, comprising:
a bumper; and
a radar sensor installed in the bumper, the radar sensor comprising:
an antenna assembly;
a monolithic microwave integrated circuit (MMIC) arranged on a circuit board, the MIMIC providing at least one antenna connection to the antenna assembly by a waveguide arranged on an opposite side of the circuit board, wherein the at least one antenna connection is implemented using a ball grid; and
the circuit board comprising a through-opening at a position of the at least one antenna connection, leading to a side of the circuit board opposite the MIMIC, wherein:
the at least one antenna connection is connected, through the through-opening, to a radiation element projecting into the waveguide exceeding an inlet region of the waveguide;
the radiation element being surrounded by an annular insulation element at least in the inlet region into the waveguide; and
the through-opening comprises a through-plated hole connected to the radiation element.

* * * * *